(12) United States Patent
Falk

(10) Patent No.: US 6,580,281 B2
(45) Date of Patent: Jun. 17, 2003

(54) EXTERNALLY INDUCED VOLTAGE ALTERATIONS FOR INTEGRATED CIRCUIT ANALYSIS

(76) Inventor: Robert A. Falk, 15509 SE 184th, Renton, WA (US) 98058

( * ) Notice: Subject to any disclaimer, the term of this patent is extended or adjusted under 35 U.S.C. 154(b) by 0 days.

(21) Appl. No.: 09/850,842

(22) Filed: May 7, 2001

(65) Prior Publication Data

US 2002/0163352 A1 Nov. 7, 2002

Related U.S. Application Data

(60) Provisional application No. 60/270,829, filed on Feb. 22, 2001.

(51) Int. Cl.$^7$ .............................................. G01R 31/26
(52) U.S. Cl. ........................ 324/751; 324/752; 324/501
(58) Field of Search .................................. 324/750, 751, 324/752, 765, 501; 250/310, 311; 438/14, 17–18

(56) References Cited

U.S. PATENT DOCUMENTS

| | | | | |
|---|---|---|---|---|
| 4,564,807 A | * | 1/1986 | Ikezi et al. ................... | 324/767 |
| 5,298,797 A | * | 3/1994 | Redl ........................... | 327/311 |
| 5,430,305 A | | 7/1995 | Cole, Jr. et al. | |
| 5,952,837 A | * | 9/1999 | Koyama ..................... | 324/752 |
| 6,078,183 A | | 6/2000 | Cole, Jr. | |

OTHER PUBLICATIONS

Orugani et al ;"Inductor Voltage Controlled Variable Power Factor Buck Type AC–DC Converter", 1996 IEEE, pp. 230–237.*

Cole et al., "Backside Localization of Open and Shorted IC Interconnections", 1998, 36$^{th}$ Annual International Reliability Physics Symposium, Reno, Nevada, pp. 129–136.

* cited by examiner

Primary Examiner—Vinh P. Nguyen
(74) Attorney, Agent, or Firm—Black Lowe & Graham PLLC

(57) ABSTRACT

A method and circuit for integrated circuit analysis. The apparatus includes an irradiation component configured to irradiate an integrated circuit, a constant voltage source, one or more current chokes placed between the constant voltage source and one or more connections to the integrated circuit, and one or more voltage amplifiers. The irradiation component introduces changes in the electrical state of the integrated circuit. The one or more voltage amplifiers produces a state signal relating to the changes introduced by the irradiation component in the integrated circuit. The current choke separates the function, a DC function, of supplying a voltage bias to the integrated circuit from the function, an AC function, of signal generation. This allows separate optimization of the two functions—the ability to correctly bias the integrated circuit and obtain high signal-to-noise ratios for the resulting signal. This optimization improves the sensing abilities of the circuit.

21 Claims, 7 Drawing Sheets

EXTERNALLY INDUCED VOLTAGE ALTERATIONS FOR INTEGRATED CIRCUIT ANALYSIS

PRIORITY CLAIM

This application claims priority to U.S. Provisional Patent Application Ser. No. 60/270,829 filed Feb. 22, 2001.

FIELD OF THE INVENTION

This invention relates to methods and apparatus for analyzing failures in semiconductor circuits.

BACKGROUND OF THE INVENTION

LIVA (Light Induced Voltage Alterations), U.S. Pat. No. 5,430,305, and TIVA (Thermally Induced Voltage Alterations), U.S. Pat. No. 6,078,183, have demonstrated significant capability to for fault isolation in semiconductor circuits. A difficulty with both techniques is their use of a constant current bias, whereas integrated circuits operate on constant voltage bias. OBIRCH (Optical Beam Induced Resistance Changes), U.S. Pat. No. 5,952,837, utilizes constant voltage bias, however, tests have shown that LIVA/TIVA is as much as two orders of magnitude more sensitive ("Backside Localization of Open and Shorted Interconnections" E. I. Cole, Jr. et al., International Reliability Physics Symposium, pp. 129–136, 1998).

The current invention utilizes a new technique for fault isolation in semiconductors that makes use of the constant current sensing of LIVA/TIVA, while allowing for use of constant voltage bias on the integrated circuit. The operational advantages include: correct biasing of the integrated circuit, ability to change the state of the integrated circuit without also having to change the current bias conditions, and ability to utilize the technique on lines other than power lines. In addition, the technique is significantly more sensitive (at least one order of magnitude) than the standard LIVA/TIVA approach.

LIVA, TIVA, and OBIRCH all utilize a scanned optical beam from a laser scanning microscope to stimulate a device under test (DUT). Nominally, the DUT consists of a semiconductor integrated circuit, which consists of passive (resistors, capacitors) and active (transistors) elements on a semiconductor substrate. Modern integrated circuits can also contain electro-mechanical and sensor elements. In the case of LIVA, the stimulation is due to carrier production by the optical beam in the semiconductor. For TIVA and OBIRCH, the stimulation is thermal only (e.g. the wavelength of the laser is selected such that no carrier production occurs). In each case, the response of the device under test is recorded versus scanner position to produce an image. Nominally, the recording and display utilize an analog to digital (A/D) conversion, a general-purpose computer and a monitor. The response image corresponds to the reflected light image that can also be recorded by the microscope. The response image can indicate the presence and character of a number of failures as described in the referenced patents and papers.

The distinction between the LIVA/TIVA and OBIRCH techniques lies in the use of a constant current source versus constant voltage source for the DUT bias. The constant voltage approach is consistent with normal operation of an integrated circuit; however, the constant current approach has several orders of magnitude more sensitivity. The current invention seeks to maintain the optimum bias approach (constant voltage) while producing signal strengths associated with the constant current approach. This desire can be realized by recognizing that the DUT bias requirement lies in low frequency or DC regime, where as the signals lie at higher, AC, frequencies and can thereby be separated by suitable circuitry. An additional benefit is to separately optimize the bias circuitry and the signal circuitry, which produces increased signal-to-noise.

One method for performing this separation applies constant voltage bias to the DUT through a choke coil. The coil does not affect the DC bias of the DUT. However, when the DUT is stimulated by the scanned optical beam it momentarily attempts to draw more (or less) current from the bias circuit. The choke coil temporarily suppresses this change in current, i.e. it acts as an AC constant current source. The voltage across the DUT (or coil) will change just as for the LIVA/TIVA systems. An amplifier can be used to increase the signal strength.

Additionally, optimization of the bias circuitry and the sensing circuitry is now separated. In both LIVA/TIVA and OBIRCH, the bias circuits (power supplies) are producing the voltage or current (respectively) signal that is then amplified. Power supplies are not known to be optimized for their signal generation properties.

Clearly other circuits (more complex, with feedback, etc.) can also be utilized to obtain the same separation of circuit bias and signal sensing, however, the basic operational principles of separation in the frequency domain would be identical. Scanned electron beams and ion beams are also utilized for stimulation of semiconductor circuits in order to locate failures. The invented sensor arrangement can also be utilized with these forms of stimulation of the circuit.

SUMMARY OF THE INVENTION

The present invention provides an apparatus for integrated circuit analysis. The apparatus includes an irradiation component configured to irradiate an integrated circuit, a constant voltage source, one or more current chokes placed between the constant voltage source and one or more connections to the integrated circuit, and one or more voltage amplifiers. The irradiation component introduces changes in the electrical state of the integrated circuit. The one or more voltage amplifiers produces a state signal relating to the changes introduced by the irradiation component in the integrated circuit. The current choke separates the function, a DC function, of supplying a voltage bias to the integrated circuit from the function, an AC function, of signal generation. This allows separate optimization of the two functions—the ability to correctly bias the high signal-to-noise ratios for the resulting signal. This optimization improves the sensing abilities of the circuit.

In accordance with further aspects of the invention, the apparatus further includes a component for focusing and scanning the irradiation over the integrated circuit, wherein the scanning acts to modulate the irradiation.

In accordance with other aspects of the invention, the irradiation is from one of a laser source, an electron beam or an ion beam.

In accordance with still further aspects of the invention, the apparatus further includes a component for recording and displaying an image of the state signal as a function of scan position.

In accordance with yet other aspects of the invention, the apparatus further includes a component for producing an image of the integrated circuit. The produced image is utilized to correlate the state signal to corresponding positions on the integrated circuit.

As will be readily appreciated from the foregoing summary, the invention provides an integrated circuit analysis device with improved sensing capabilities.

BRIEF DESCRIPTION OF THE DRAWINGS

The preferred and alternative embodiments of the present invention are described in detail below with reference to the following drawings.

DETAILED DESCRIPTION OF THE INVENTION

Figure 1:
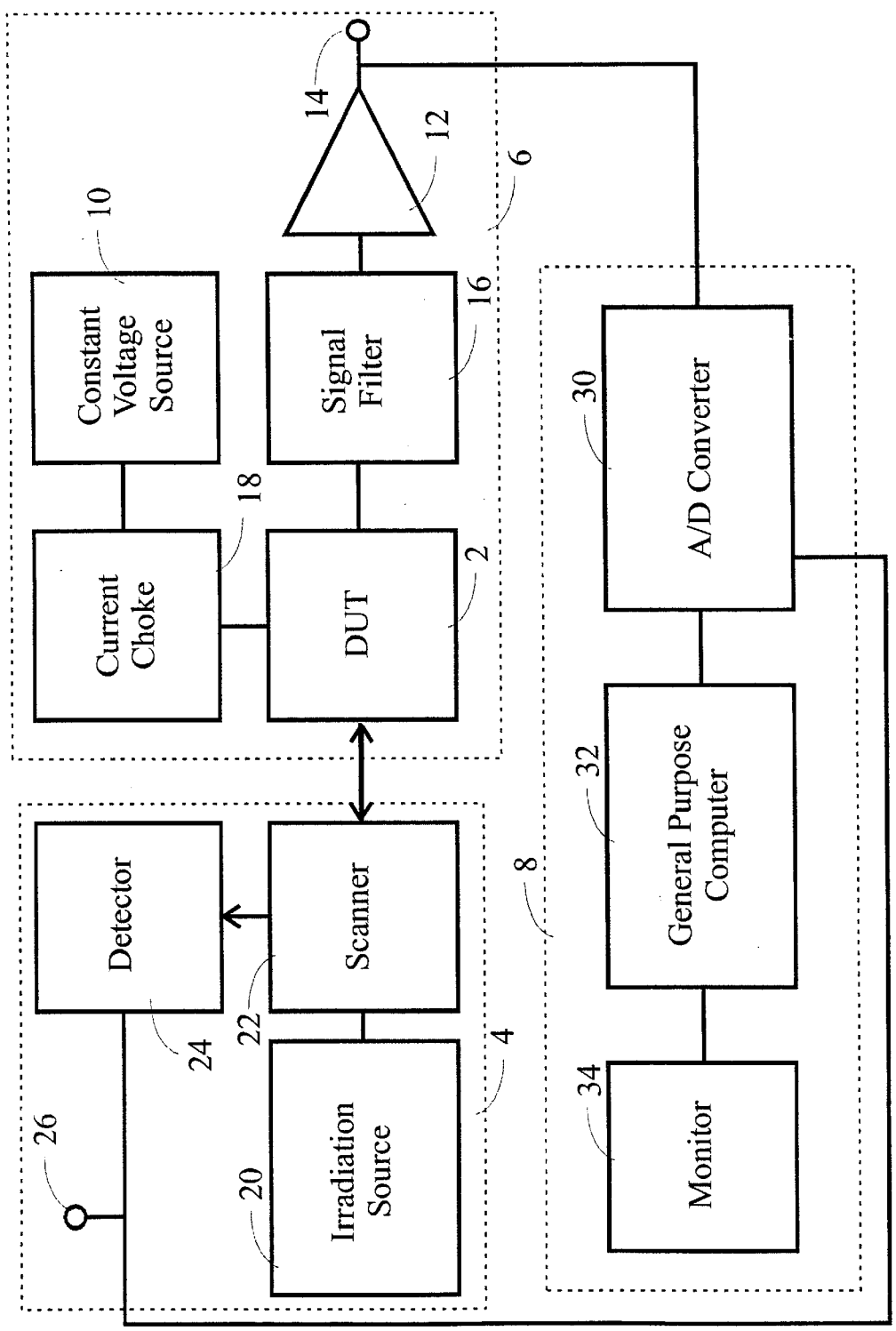
FIG. 1 is a block diagram of a complete measurement system.

FIG. 1 sets forth a preferred embodiment of a complete Externally Induced Voltage Alteration (XIVA) system as applied to analyzing an integrated circuit 2 (device under test or DUT). The XIVA system comprises three major components, a modulated irradiation source 4, an electronic sensor 6, and a display means 8.

The integrated circuit 2 nominally comprises a set of active (transistors and diodes) and passive (resistors and capacitors) electronic components on a semiconductor substrate (e.g. silicon, gallium arsenide, and plastic semiconductors). Recent technological advances necessitate the extension of this nominal set of components to include integrated circuits with electromechanical components, so called micro-electromechanical systems (MEMS). An additional extension is to integrated circuits that contain sensing elements such as chemical sensors.

In the preferred embodiment, the modulated irradiation source 4, comprises an irradiation source 20, a scanner 22, and a detector 24. The irradiation source can be an optical source, an electron-beam source, an ion-beam source or any source of irradiation that can affect the operating condition of the integrated circuit 2. Changes in the operating condition of the integrated circuit can come about due to introduction of free carriers in the integrated circuit 2 or to thermal heating of components in the integrated circuit. When the irradiation source 20 is an optical source, the operating condition or the integrated circuit 2 can be affected when carriers are introduced via photovoltaic and photoconductive effects. Optical sources can also introduce heating effects due to temperature dependence of metal resistance or thermal electric effects. Generally, introduction of free carriers causes stronger changes in the integrated circuit 2 operating condition than heating. Use of optical wavelengths below the semiconductor bandgap allows heating without carrier generation, producing one approach to separating the two effects. Electron-beam and ion-beam irradiation sources can also introduce free carriers and cause heating in the integrated circuit 2.

The scanner 22 directs (focuses) the irradiation from the irradiation source 20 onto the integrated circuit 2. The scanner 22 further scans the focused irradiation over the integrated circuit. Scanning performs two functions 1) it localizes the effect of the irradiation source 20, and 2) it effectively modulates the irradiation source 20. Modulation occurs as only a portion of the integrated circuit is irradiated at any particular time, that portion changing with time as the irradiation source 20 is scanned. Thus, the operating condition of the integrated circuit 2 is a function of time (and therefore position) and is thereby modulated. Other modulation formats (e.g. chopping of the irradiation source 20) are also possible.

The irradiation source 4, also contains a detector 24. The detector 24 collects irradiation returned from the integrated circuit 2 through the scanner and converts it into an image signal 26. For the case of optical irradiation, the detector 24 could be a photodetector and an amplifier that produces an electronic image signal 26 proportional to the amount of optical irradiation reflected from the integrated circuit 2.

Use of the scanner 22 implies generation of images. The display means 8 allows for display of these images. The preferred embodiment of the display means includes an analog-to-digital (A/D) converter 30, a general-purpose computer 32, and a monitor 34. The A/D converter 30 takes in electrical signals as a function of scanner position so as to produce a digital array of data. The general-purpose computer 32, controls and coordinates the scanner 22 and the A/D converter 30. The general-purpose computer also conditions the data array produced by the A/D converter 30 for display as an image on the monitor 34. As shown in FIG. 1, the two signals taken in by the A/D converter are the image signal 26 and a state signal 14.

A clear understanding of the distinction of the preferred embodiment of the electronic sensor 6 over the approaches utilized in OBIRCH and LIVA/TIVA requires a brief review of their general operating principles. Note is made of the fact that the integrated circuit 2 is an integral part of the electronic sensor 6 in all approaches.

Figure 2:
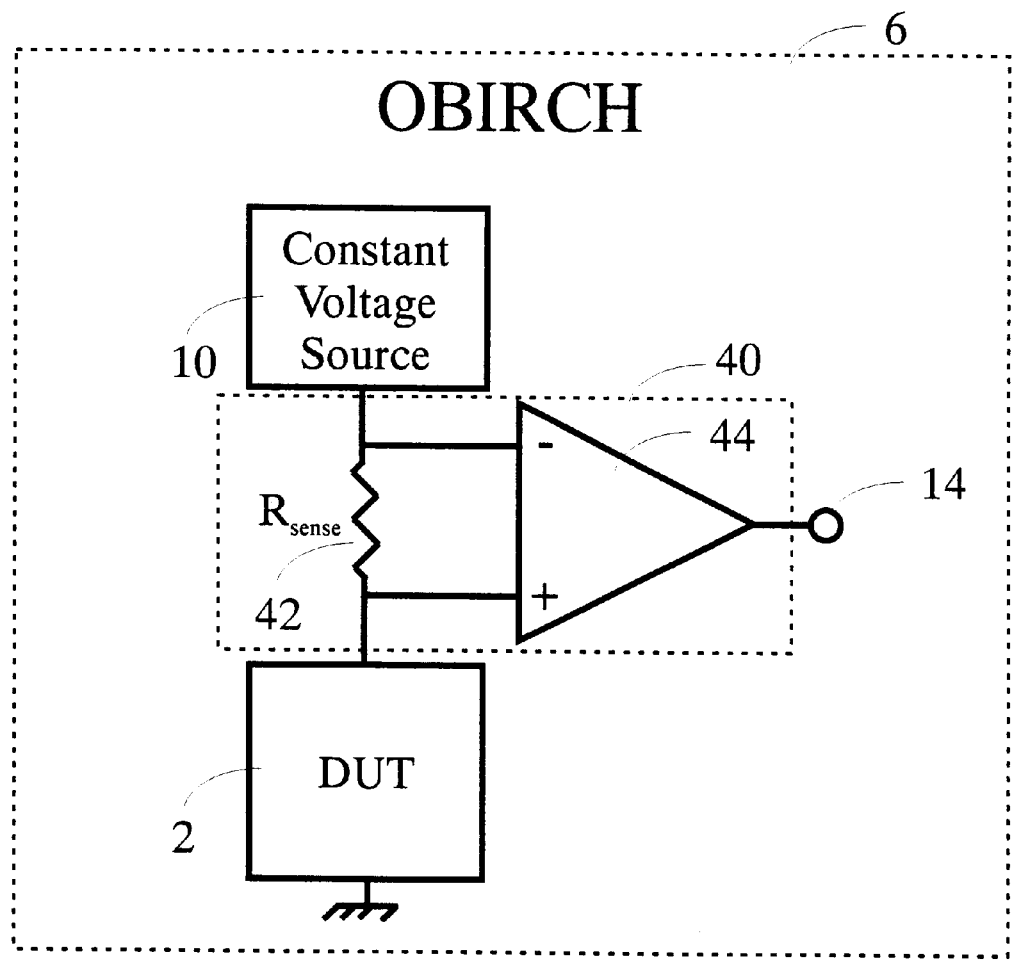
FIG. 2 shows details of an OBIRCH approach to integrated circuit sensing electronics.

FIG. 2 is a schematic of the electronic sensor 6 utilized for OBIRCH. A constant voltage source 10 is connected to a current sensor 40, which is in turn connected to the integrated circuit 2. U.S. Pat. No. 5,952,837 does not describe a specific embodiment for the current sensor 40. One standard approach to current sensing is to place a sense resistor 42 between the constant voltage source 10 and the integrated circuit 2. A differential voltage amplifier 44 produces a state signal 14 that is proportional to the current flow in the integrated circuit 2.

Figure 3:
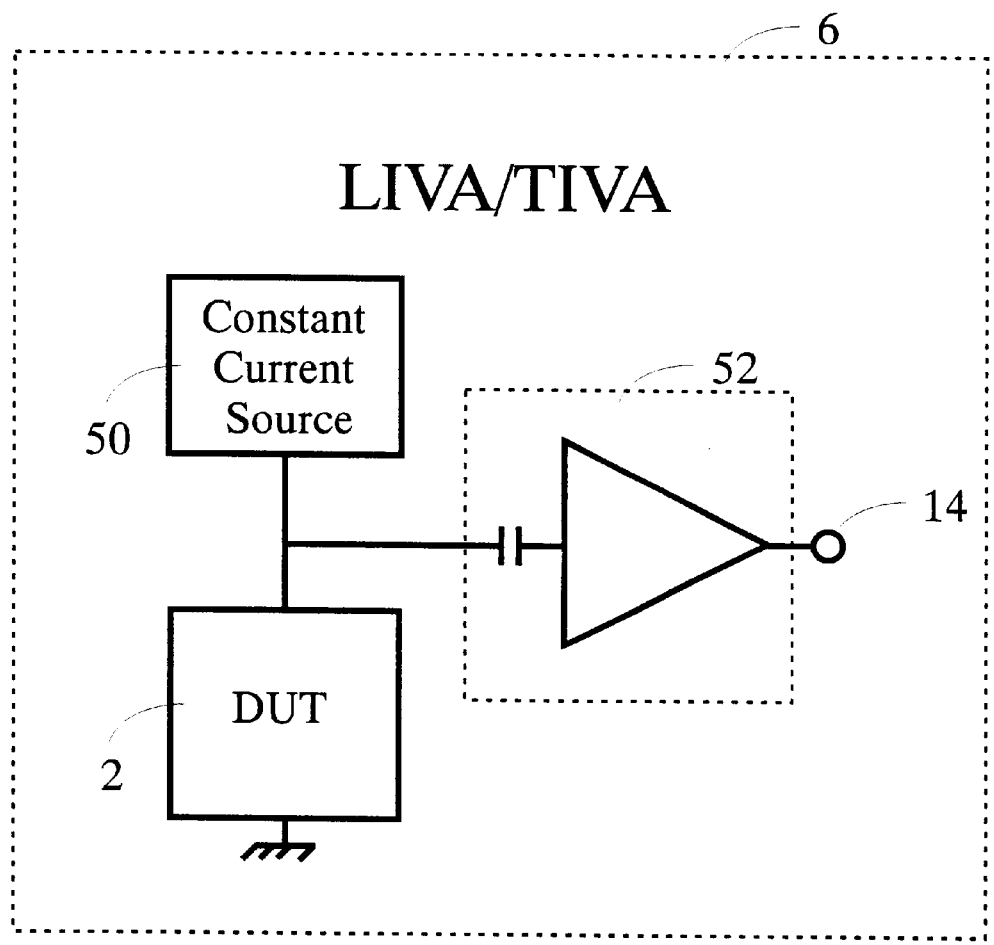
FIG. 3 shows details of LIVA/TIVA approach to integrated circuit sensing electronics.

FIG. 3 is a schematic of the electronic sensor 6 utilized for LIVA/TIVA. A constant current source 50 is connected directly to the integrated circuit 2. An AC amplifier 52 produces a state signal 14 proportional to changes in the voltage across the integrated circuit 2. Clearly, an AC amplifier could also be used for OBIRCH, although none is specified in U.S. Pat. No. 5,952,837.

OBIRCH offers the advantage of constant voltage bias, which is generally the correct form of power bias and signal line bias for an integrated circuit. Experimentally, LIVA/TIVA is found to be significantly more sensitive to state changes in the integrated circuit 2 and therefore more successful at analyzing the circuit conditions. One potential explanation is that the value of the sense resistor 42 must be chosen to be small compared to the resistance of the integrated circuit 2 so as to not adversely affect circuit operation. For LIVA/TIVA the resistance of the integrated circuit 2 is directly utilized to obtain the state signal 14. The two circuits will have similar noise properties, however, the state signal 14 for the two approaches will be proportional to the ratio of the value of the sense resistor 42 to the resistance of the integrated circuit 2. Thus, OBIRCH could be expected to have a significantly lower signal-to-noise ratio than LIVA/TIVA.

An additional issue for both approaches is that the state signal 14 is the result of the reaction of the constant voltage source 10 or the constant current source 50 to changes in the state of the integrated circuit 2. Specifically, the state signal 14 that occurs in OBIRCH is a result of a change in current from the constant voltage source 10 in response to a change in the integrated circuit 2 drive requirements induced by the modulated irradiation source 4. Similarly, the state signal 14 that occurs in LIVA/TIVA results from a change in voltage from the constant current source 50 in response to a change in the integrated circuit 2 drive requirements induced by the modulated irradiation source 4. The constant voltage source 10 and the constant current source 50 are typically power supplies or signal line drivers and are not optimized for signal generation.

Figure 4:
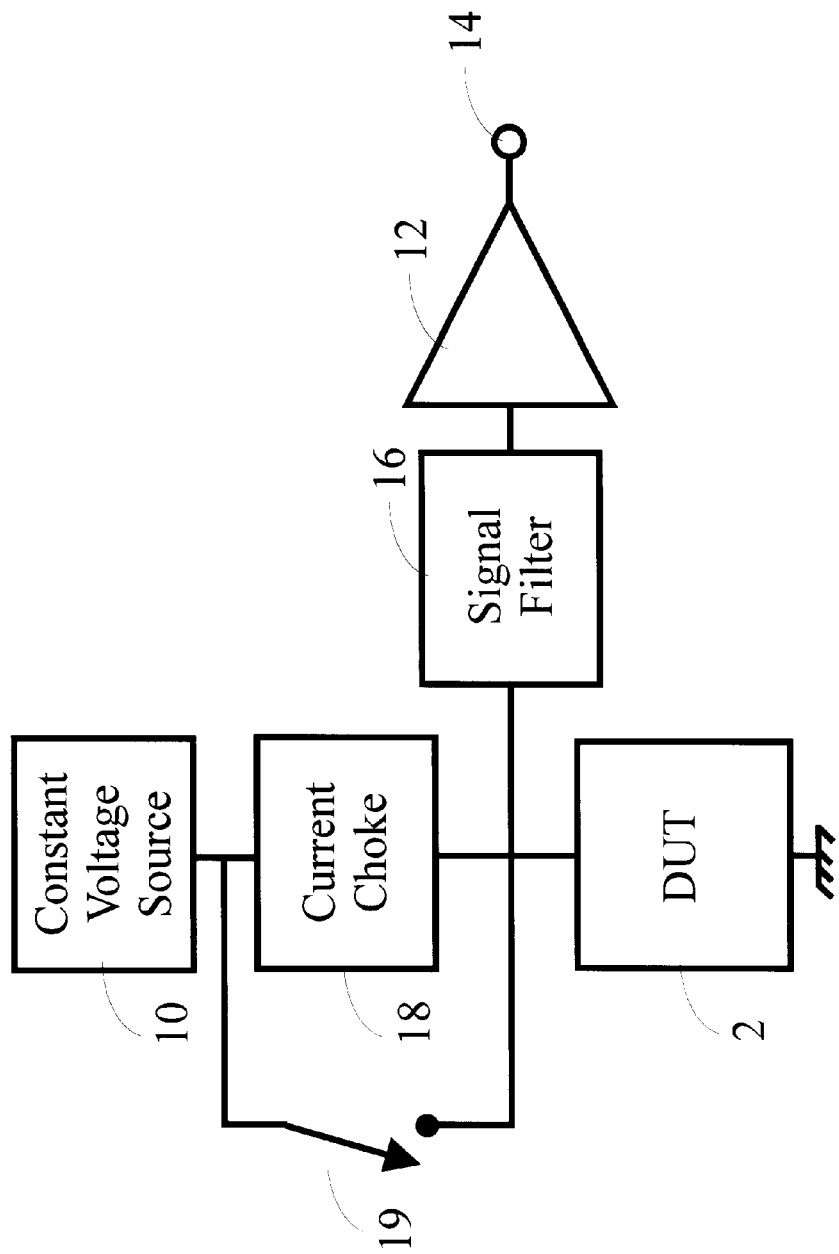
FIG. 4 shows a block diagram of integrated circuit sensing electronics for the current invention.

The details of the electronic sensor 6 for the current invention shown in FIG. 1 are reproduced in detail in FIG. 4. The electronic sensor 6 comprises the constant voltage source 10 connected to a current choke 18 that is then connected to the integrated circuit 2. The integrated circuit 2 is also connected to a signal filter 16 followed by an amplifier 12 to produce the state signal 14. The current choke 18 acts as an inductive element. It is designed to have a low voltage drop, so as to allow constant voltage bias of the integrated circuit 2 independent of the static current flow in the circuit. However, when the modulated irradiation source 4 induces changes in the integrated circuit 2 power requirements, the current choke 18 will act to temporarily hold off changes in the current flow to the integrated circuit 2. Thus, the current choke 18 acts as a temporary constant current source, while the integrated circuit 2 average voltage bias remains constant. In this fashion, the state signal 14 is the same as for constant current bias, while actually utilizing a constant voltage bias 10. Moreover, the current choke 18, not the constant voltage source 10 is now performing a signal generation function and can be independently optimized.

Stated differently, the current choke 18 separates the DC function of supplying voltage bias to the integrated circuit 2 from the AC function of signal generation. This separation into the two frequency domains allows separate optimization of the two functions; the ability to correctly bias the integrated circuit 2 and obtain high signal-to-noise ratios for the state signal 14 result.

An additional change from the prior art for the electronic sensor 6 is the inclusion of the signal filter 16. Changes induced in the integrated circuit 2 by the modulated irradiation source 4 will have characteristic time signals. For example, a photoconductive response to a pulsed optical irradiation can be a fast rise while the irradiation is present followed by a slow exponential decay. Use of appropriate filters can enhance this particular signal over others with a different time signature and over noise present in the electrical sensor 6. Although shown placed between the integrated circuit 2 and the amplifier 12, the signal filter 16 can be placed or even distributed throughout the electronic sensor 6. In fact, the current choke 18 acts to filter noise present on the constant voltage source and can be considered part of the signal filter 16.

A final feature of the electronic sensor 6 in the present invention is a bypass switch 19. At times, it will be desirable to externally change the state of the integrated circuit 2. For example, the integrated circuit 2 may be a digital processor. A program may be run in the processor to set its state prior to examination with the XIVA system. During program execution, the integrated circuit current draw can change dramatically. The current choke will act to suppress these changes and may cause failure of the program and state change of the integrated circuit 2. The bypass switch 19 is utilized to temporarily bypass the current choke and allow external changes in the integrated circuit 2 state.

Figure 5:
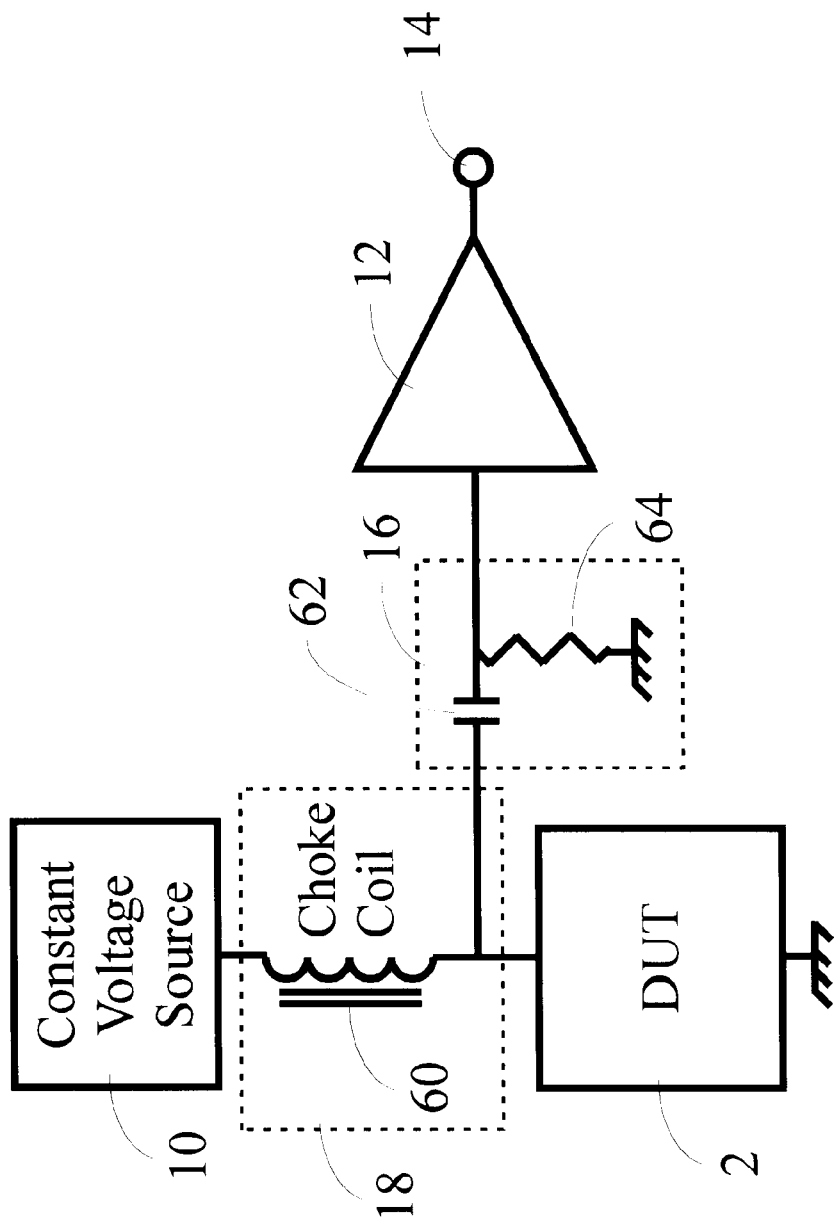
FIG. 5 is a first embodiment of integrated circuit sensing electronics for the current invention.
Figure 6:
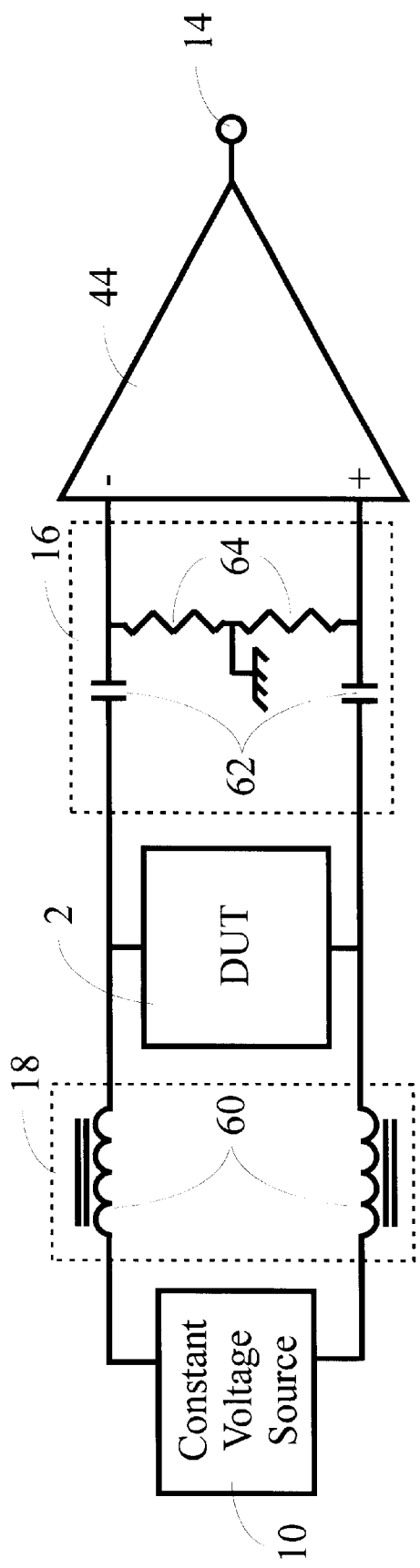
FIG. 6 is a second embodiment of integrated circuit sensing electronics for the current invention.
Figure 7:
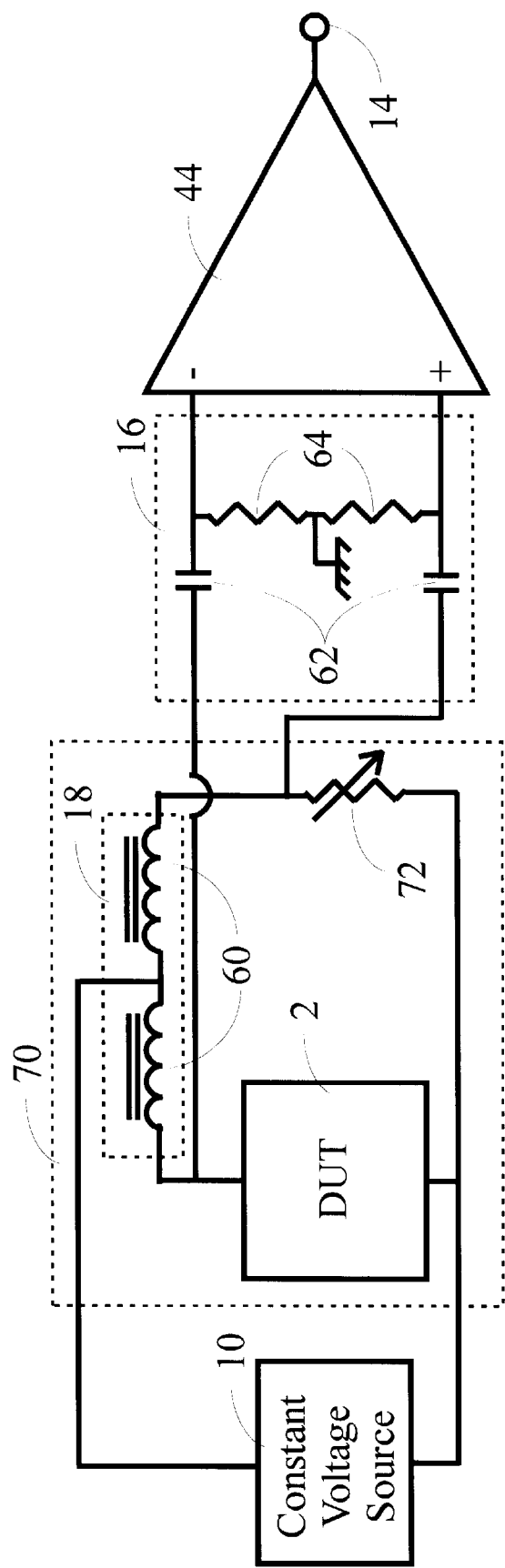
FIG. 7 is a third embodiment of the integrated circuit sensing electronics for the current invention.

FIGS. 5–7 show specific embodiments of the electronic sensor 6. FIG. 5 shows a very simple embodiment wherein the current choke 18 is a single choke coil (inductor) 60. The signal filter 16 is a simple high-pass filter consisting of a capacitor 62 and a resistor 64. As described above, the choke coil 60 is also acting as part of the signal filter 16 as it blocks high frequency noise from the constant voltage source 10.

Pick up noise on the lines connecting a circuit is often a predominate noise source in an electronic sensor system. FIG. 6 shows an embodiment of the electronic sensor 6 that reduces much on this noise. This embodiment uses a floating (ungrounded) biasing arrangement. A pair of choke coils 60 are placed on both lines between the constant voltage source 10 and the integrated circuit 2 (now floating), which suppresses high frequency pick-noise on both lines. Similarly, two lines connect between the integrated circuit 2 and the signal filter 16, which utilizes a balanced filter arrangement. These lines are then passed to the differential amplifier 36 to produce the state signal 14. Generally, the line pairs are twisted which causes the same pickup noise to be present on both lines. The differential amplifier 36 subtracts out this common noise. Note that the differential amplifier 36 is now acting as part of the signal filter 16.

Noise and drift of the constant voltage source 10 can also reduce the ability of the electronic sensor to produce high quality state signals 14. FIG. 7 shows a Wheatstone bridge 70 arrangement for the electronic sensor 6, which nulls out variations in the constant voltage supply. A variable impedance 72 is utilized to match the impedance of the integrated circuit 2. When correctly matched, the Wheatstone bridge 70 is balanced and variations in the constant voltage source 10 are rejected.

The embodiments of the invention in which an exclusive property of privilege is claimed are defined as follows:

1. A method for analyzing an integrated circuit, the method comprising:
    irradiating the integrated circuit, thereby introducing changes in the electrical state of the integrated circuit;
    providing a constant voltage source to the integrated circuit;
    temporarily holding off changes in integrated circuit current flow, when the irradiating induces changes in the integrated circuit power requirements; and
    producing a state signal relating to the changes introduced by irradiating in the integrated circuit.

2. The method of claim 1, wherein producing a state signal including filtering the changes induced by the modulated irradiation of the integrated circuit.

3. The method of claim 2, wherein producing a state signal including further includes amplifying the filtered changes induced by the modulated irradiation of the integrated circuit.

4. The method in claim 1, further comprising recording and displaying an image of the state signal as a function of scan position on the integrated circuit.

5. The method in claim 4, further comprising producing an image of the integrated circuit, said image being utilized to correlate the state signal to corresponding positions on the integrated circuit.

6. An apparatus for analyzing an integrated circuit, the apparatus comprising:
    (a) a constant voltage source attached to an integrated circuit, said constant voltage source used to supply an operating voltage to said integrated circuit with said integrated circuit having been placed into an operating condition;

(b) a means for supplying modulated irradiation to the integrated circuit, said modulated irradiation changing the state of the integrated circuit;

(c) one or more current chokes placed between the voltage source and the integrated circuit, said current chokes producing a signal relating to the change in state induced by the modulated irradiation.

7. The apparatus in claim 6, further comprising one or more voltage amplifiers for amplifying the produced state signal.

8. The apparatus in claim 7, further comprising a means for focusing and scanning the irradiation over the integrated circuit, wherein the means for the scanning modulates the irradiation.

9. The apparatus in claim 8, wherein the irradiation is a laser source.

10. The apparatus in claim 8, wherein the irradiation is an electron beam.

11. The apparatus in claim 8, wherein the irradiation is an ion beam.

12. The apparatus in claim 6, further comprising a means for recording and displaying an image of the produced signal.

13. The apparatus in claim 12, further comprising a means for producing an image of the integrated circuit, said image being utilized to correlate the produced signal to corresponding positions on the integrated circuit.

14. The apparatus in claim 6, further comprising a means for filtering the signal.

15. The apparatus in claim 6, further comprising a means for temporarily bypassing the one or more chokes and allowing external changes in the integrated circuit's state.

16. An apparatus for analyzing an integrated circuit, the apparatus comprising:

(a) a constant voltage source attached to an integrated circuit, said constant voltage source used to supply an operating voltage to said integrated circuit with said integrated circuit having been placed into an operating condition;

(b) a means for supplying modulated irradiation to the integrated circuit, said modulated irradiation changing the state of the integrated circuit;

(c) one or more current chokes placed between the voltage source and the integrated circuit, said current chokes producing a signal relating to the change in state induced by the modulated irradiation.

17. The apparatus of claim 16, further comprising a means for filtering the changes induced by the modulated irradiation of the integrated circuit.

18. The apparatus of claim 17, further comprising a means for amplifying the filtered changes induced by the modulated irradiation of the integrated circuit.

19. The apparatus in claim 16, further comprising a means for temporarily bypassing means for holding off changes in integrated circuit current flow.

20. The apparatus in claim 16, further comprising means for recording and displaying an image of the produced signal.

21. The apparatus in claim 20, further comprising a means for producing an image of the integrated circuit, said image being utilized to correlate the produced signal to corresponding positions on the integrated circuit.

* * * * *